United States Patent [19]

Duperray et al.

[11] Patent Number: 5,455,225

[45] Date of Patent: Oct. 3, 1995

[54] METHOD OF PRODUCING A METAL SUPERCONDUCTIVE CERAMIC CONNECTION

[75] Inventors: Férard Duperray, La Norville; Simon Lempereur, Villejuif, both of France

[73] Assignee: GEC Alsthom SA, Paris, France

[21] Appl. No.: 124,561

[22] Filed: Sep. 22, 1993

Related U.S. Application Data

[63] Continuation of Ser. No. 732,532, Jul. 19, 1991, abandoned.

[30] Foreign Application Priority Data

Jul. 20, 1990 [FR] France ................... 90 09313

[51] Int. Cl.⁶ ........................................ B22F 3/12
[52] U.S. Cl. ........................ 505/490; 264/61; 419/10; 419/20; 419/21; 505/500
[58] Field of Search ................ 505/490, 491, 505/500; 419/6, 10, 19, 20, 21, 22, 38, 42; 264/61

[56] References Cited

U.S. PATENT DOCUMENTS

| 3,057,445 | 10/1962 | Bronnes | 189/36.5 |
|---|---|---|---|
| 5,179,075 | 1/1993 | Leriche et al. | 505/1 |
| 5,284,823 | 2/1994 | Chou et al. | 501/1 |

FOREIGN PATENT DOCUMENTS

| 0292126 | 11/1988 | European Pat. Off. | H01L 39/12 |
|---|---|---|---|
| 0368791 | 5/1990 | European Pat. Off. | C04B 37/00 |

OTHER PUBLICATIONS

IEEE Transactions on Magnetics, vol. 25, No. 2, Mar. 1989, New York, US, pp. 2056–2059; J. Moreland et al.: "Ag screen contacts to sintered Yba2Cu3Ox powder for rapid semiconductor characterization".

Applied Physics Letters, vol. 54, No. 25, Jun. 19, 1989, New York, USA, pp. 2605–2607; S. Jin et al: "Low-resistivity contacts to bulk high TC superconductors".

World Patent Index Latest, Derwent Publications Ltd., London, Great Britain, Week 8544 & JP-A-60186483 (Shinmeiwa Ind KK) Sep. 21, 1985. (abstract only).

Proceedings of the 21st Automotive Technology Development Contractors' Coordination Meeting Mar. 1984, Warrendale, Pa., pp. 223–229; A. J. Moorhead et al.: "Dispersed metal-toughened ceramics and ceramic brazing".

Primary Examiner—Christopher A. Fiorilla
Attorney, Agent, or Firm—Sughrue, Mion, Zinn, Macpeak & Seas

[57] ABSTRACT

A method of producing a high-performance connection between a metal and a solid superconductive ceramic member is effected by introducing into a mold, in juxtaposition, grains or powder of the ceramic or of its precursors and a volume of silver or gold powder, and ceramic grains or powder at the level of an incorporated silver, gold or copper porous body of the foam, straw or lattice type prior to compression of the ceramic powder and sintering of the same. The electrical connection so formed exhibits a low electrical resistance capable of carrying high currents at rated temperature without interfering with the zero resistance state of the superconductive ceramic, with the metal connection free of cracking and having a contact resistance that is substantially constant throughout the range of superconductive material operating conditions.

3 Claims, 4 Drawing Sheets

METHOD OF PRODUCING A METAL SUPERCONDUCTIVE CERAMIC CONNECTION

This is a Continuation of application Ser. No. 07/732,532 filed Jul. 19, 1991 now abandoned.

The present invention concerns a method of producing a high-performance connection between a metal and a solid superconductive ceramic member.

The problem is to implement a low electrical resistance connection between a metal and a superconductive ceramic to carry high currents at the rated temperature without interfering with its zero resistance state. A connection of this kind must have a surface resistivity lower than $10^{-10}$ $\Omega.m^2$ for a current density passing through it in the order of $10^3$ $A/cm^2$, as is the case with a current lead application.

Currently high-performance electrical contacts having a resistivity in the order of $10^{-10}$ $\Omega.m^2$ are produced on a $YBa_2Cu_3O_{7-\delta}$ type ceramic by depositing a layer of silver by cathode sputtering onto small surfaces. However, silver deposited in this way does not have sufficient adhesion to produce a strong and high-performance connection of the ceramic to a normal metal.

The article "Low-resistivity contacts to bulk high Tc superconductors" published in Appl. Phys. Lett. 54(25), 19 Jun. 1989, page 2605 describes a method entailing placing ceramic powder in a mold, inserting 0.125 mm diameter silver wires orthogonally to the layer of powder, covering with ceramic powder allowing the wires to project, compressing and firing. A method of this kind is difficult to implement because the silver wires must not be damaged when the compression is applied. Also, the wires can carry only low currents, in the order of 5 amperes.

The aforementioned article also describes another method entailing placing into a mold a homogeneous mixture of ceramic powder and silver powder, compressing and firing at a temperature of 1 030° C., which is above the melting point of silver. Bubbles are then created, particles of silver are dispersed, appear at the surface of the part and so define electrical contacts. With this method it is very difficult to control the geometry of the contacts.

French patent No 89 14432 describes a method whereby, in the mold into which the ceramic powder is introduced, there is juxtaposed to the powder, but not mixed with it, a volume of silver powder appropriate to the required shape of the connection and situated at the required location. The combination is compressed and sintered at a temperature below the melting point of silver.

It is found that this method can result in certain defects when it is applied to large parts, for example to tubes with an outside diameter greater than 20 mm, a thickness greater than 2 mm and a length greater than 120 mm.

When a part of this kind is removed from the mold, cracking or breaking may occur at the ceramic-silver interface; also, the connection is somewhat sensitive to thermal shock when it is soldered to a connection between the superconductive device and its electrical environment or when it is subjected to thermal cycling: cooling-heating to ambient temperature.

An object of the present invention is to implement a method enabling large superconductive parts to be obtained with a metal connection free of cracking, having excellent resistance to thermal shock and a contact resistance that is substantially constant throughout the range of superconductive material operating conditions.

The present invention consists in a method of implementing a high-performance connection between a metal and a solid superconductive ceramic member, said member being fabricated from grains or powder of said ceramic or of its precursors that are introduced into a mold, in which method, in said molds, there is juxtaposed with said ceramic grains or powder at least one volume of silver powder or gold powder appropriate to the shape of said connection and situated at the required location, the ceramic is compressed and sintered, which method is characterized in that there is integrated into said mold, at the level of said connection, a silver, gold or copper body of a porous nature, of the foam, straw or mesh type, adapted to contain within its pores said volume of said silver or gold powder and some of said ceramic grains or powder.

Grains means an intermediate product made up of powder formed into spherical grains with a size between 50 μm and 350 μm, which flows more readily than the powder.

Said metal foam may be made up of broadly dodecahedron-shaped cells communicating through their pentagon-shaped surfaces, there being metal only at the edges.

Metal straw refers to an assembly of interleaved metal fibres.

It is also possible to use metal mesh materials of adequate mesh size, provided that multiple thicknesses are stacked together.

All these structures have better than 85% porosity. The diameter of their pores must be matched to that of the grains which is between 200 μm and 1 mm. They have a high conductivity and the current flows through conductive strands.

In one embodiment, pellicular silver powder is integrated into said grains in an amount of less than 15% by weight. Pellicular silver powder means powder in which the grains are disks with a diameter between 10 μm and 40 μm and a thickness between 0.1 μm and 0.5 μm.

The method in accordance with the invention can be used to produce large parts without cracking or breaking at the connection with the metal which is strongly attached to the ceramic by virtue of the metal strands which are inserted into the latter. This metal constitutes a lead that can be soldered directly. Also, its structure enables it to absorb thermal stresses due to differential expansion between the metal and the ceramic, even when subject to repetitive thermal cycling.

It is noteworthy that the superconducting properties of the part obtained by use of the method in accordance with the invention are not deteriorated although significant deterioration occurs if the superconductive powder is mixed with the metal powder.

The contact resistance remains substantially constant throughout the range of superconductive material operating conditions, that is to say up to the transition point representing the critical transport current.

Other characteristics and advantages of the present invention will emerge from the following description of embodiments given by way of non-limiting example. In the appended drawings.

Figure 1:
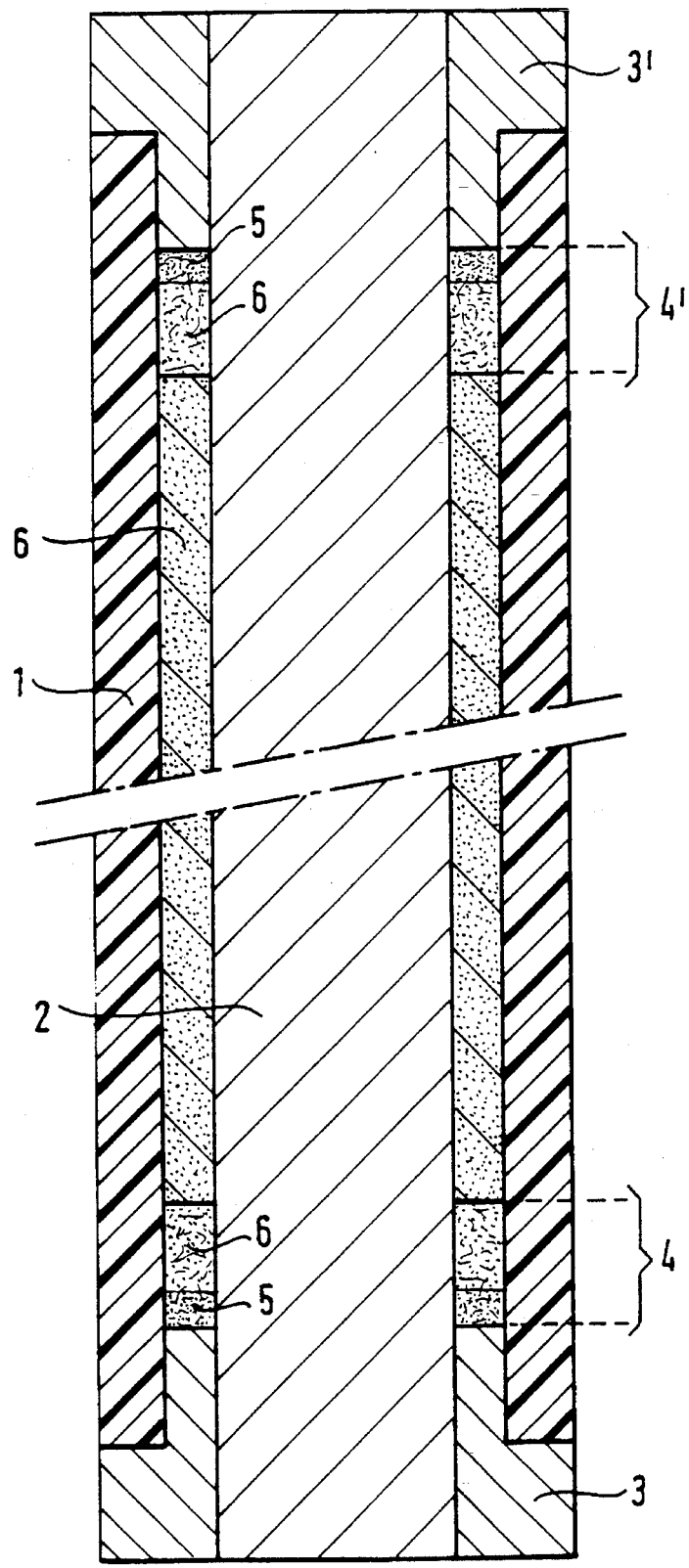
FIG. 1 shows schematically a first embodiment of the method in accordance with the invention.

EXAMPLE 1 (see FIG. 1)

A $Y_1Ba_2Cu_3O_7$ ceramic tube with an outside diameter of 20 mm, an inside diameter of 15 mm, a length of 120 mm and metal leads at both ends is made as follows.

A mold 1 with a deformable wall, adapted for isostatic compression, with a central metal pin 2 and a bottom plug 3 is used. The assembly is placed on a vibrating table (not shown). The following are introduced in succession into the annular space between the mold 1 and the pin 2:

- a ring 4 of silver foam to be described in more detail later with reference to FIG. 2; the diameter of the pores of the foam is in the order of 500 μm,
- 3 g of silver powder 5 with a diameter of 100 μm which passes through the pores in the ring 4 and drops to the bottom of the mold,
- 100 g of grains 6 of precursors for synthesizing $Y_1Ba_2Cu_3O_7$; these grains have a mean diameter of 200 μm and some of them infiltrate the ring 4,
- a ring 4' of silver foam identical to the ring 4,
- 3 g of silver powder 5.

Figure 2:
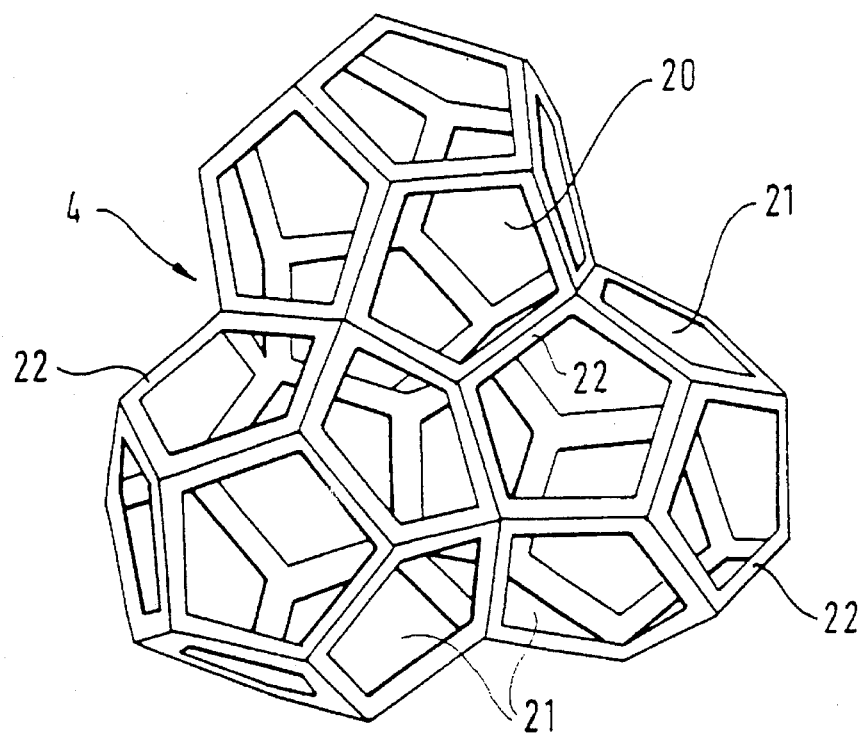
FIG. 2 is a schematic enlarged perspective view of a metal foam used in the FIG. 1 method.

Referring to FIG. 2, the silver foam 4 is in the highly approximate form of broadly dodecahedron-shaped cells 20 communicating through their pentagon-shaped surfaces 21, there being silver only at the edges 22.

When the filling of the mold 1 is completed it is closed by fitting the plug 3' and compressed to 200 Megapascals.

The tube is removed from the mold and undergoes the usual heat treatment to synthesize and sinter the superconductive phase. One example of such treatment comprises a period of 10 to 20 hours at a temperature between 880° C. and 910° C. and then a slow reduction in temperature between 600° C. and 750° C., to re-oxygenate the material in orthorhombic form; the treatment is preferably carried out in an atmosphere comprising between 20% and 100% oxygen.

Figure 3:
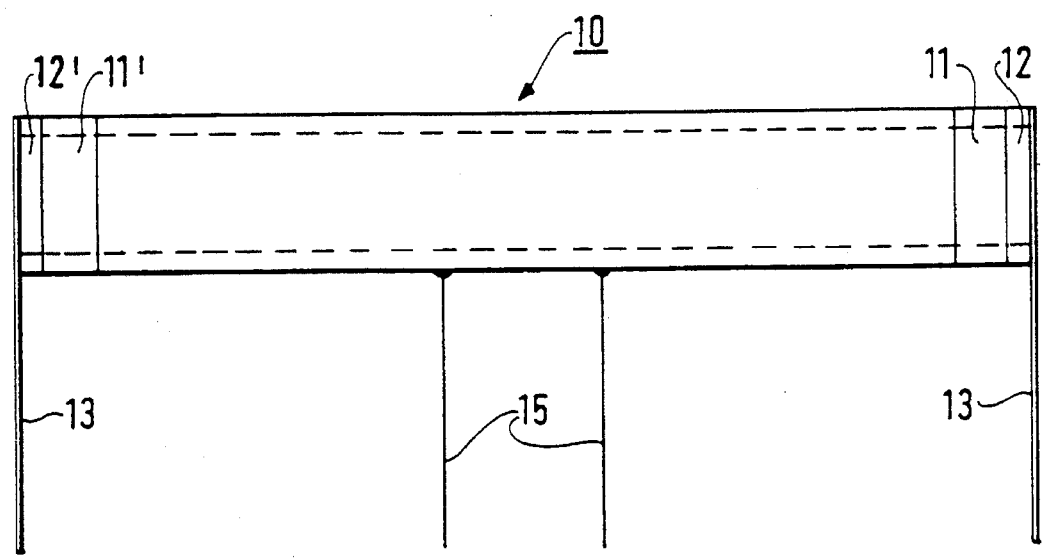
FIG. 3 is a schematic representation of a tube obtained by use of the method shown in FIG. 1.

A tube 10 shown in FIG. 3 is obtained; its metal leads comprise the areas 11 and 11' in which the foam 4 is embedded in the superconductive material and solid silver terminations 12 and 12' resulting from the combination of the foam 4–4' and the silver powder 5.

Two foils 13 and 13' are soldered to the respective terminations 12 and 12' to carry the current. After cooling in liquid nitrogen at 77 K, the resistance of the metal connections in accordance with the invention is measured as a function of the current density.

The contact resistivity $\rho_s$ is defined by the equation $\rho_s = RS$ where R is the contact resistance and S is the surface area.

Figure 4:
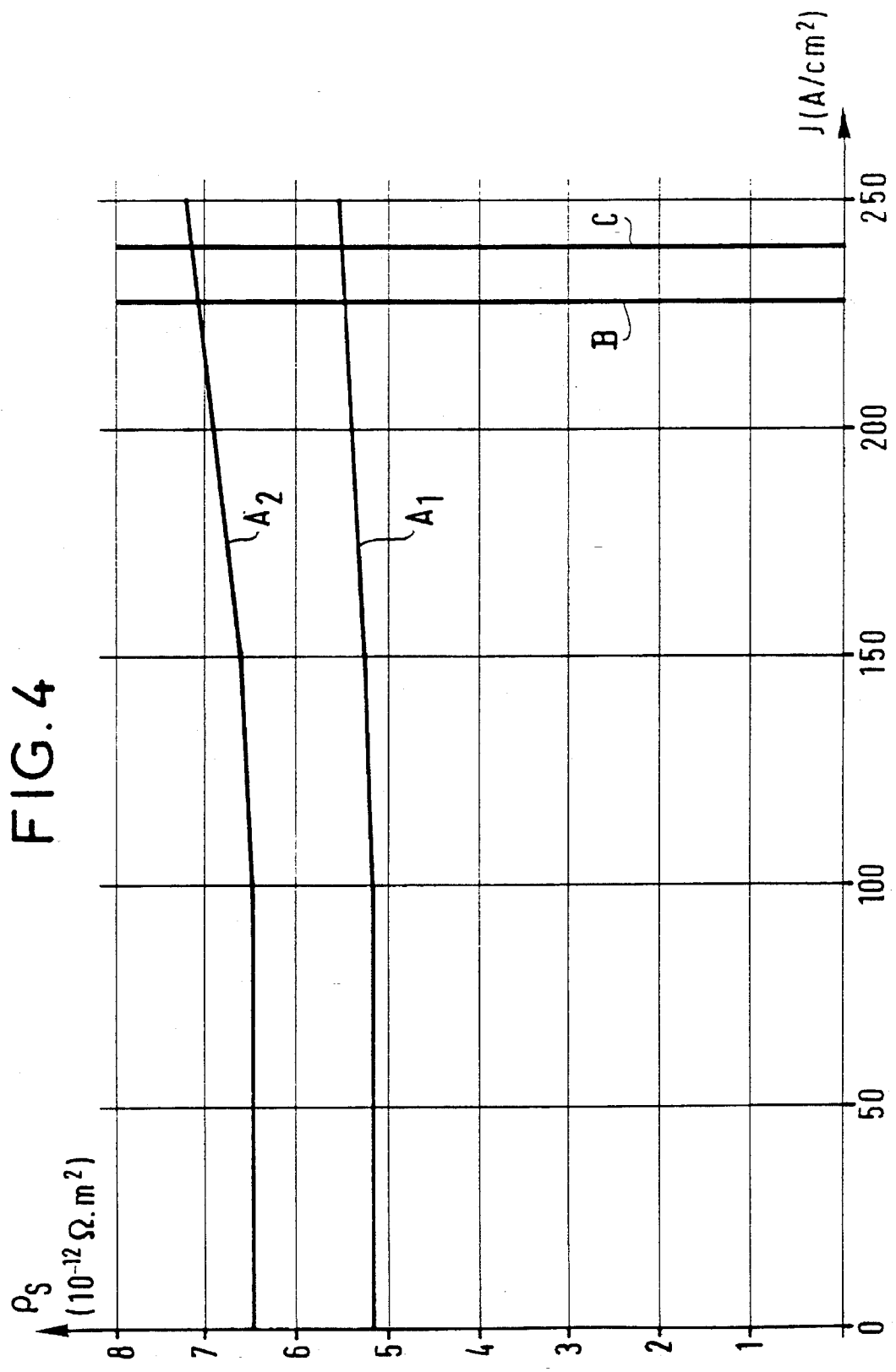
FIG. 4 shows the variation in the resistivity of the metal leads of the tube from FIG. 3 as a function of the current density.

FIG. 4 shows the variations in $\rho_s$ ($10^{-12}$ $\Omega.m^2$) as a function of the current density J ($A/cm^2$). The curves $A_1$ and $A_2$ respectively relate to the two connections of the tube 10.

Measurement contacts 15 are used to determine the critical current density value, that is to say the value for which the electrical field between the two contacts 15 becomes non-zero and equal to 1 μV/cm.

In FIG. 4 the straight line B marks the critical current density value and the straight line C marks the current density value for which an ohmic voltage drop of 10 μV/cm is observed.

Throughout this range of densities, the value of the resistivity $\rho_s$ is substantially constant and below $7.10^{-12}$ $\Omega m^2$.

Figure 5:
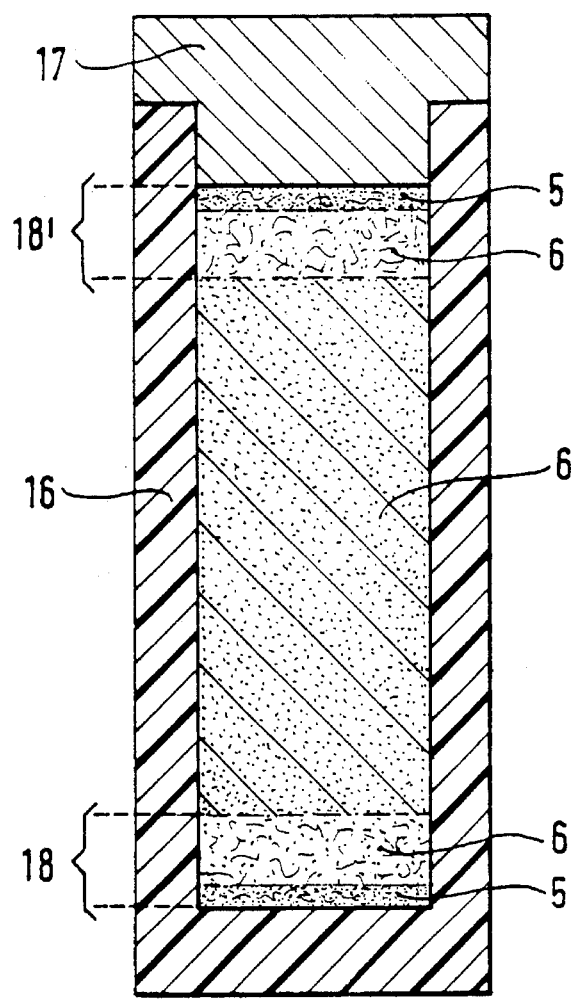
FIG. 5 is a highly schematic view of a second embodiment of the method in accordance with the invention as applied to a solid cylinder.

EXAMPLE 2 (see FIG. 5)

The method is the same as in example 1, but using a mold 16 with an inside diameter of 7 mm closed by a plug 17 and with no interior metal pin.

The object is to produce a solid cylinder with a diameter of 5 mm and a length of 150 mm.

The following are introduced in succession into this mold:

- a cylinder 18 of silver foam with a diameter of 7 mm and a height of 15 mm,
- 0.5 g of silver powder 5,
- 15 g of grains 6 of precursors,
- a cylinder 18' of silver foam similar to the ring 18,
- 0.5 g of silver powder 5.

After isostatic compression and heat treatment exactly the same as for example 1, the resistivity measurements on the metal connections obtained yield results substantially identical to those of example 1.

Figure 6:
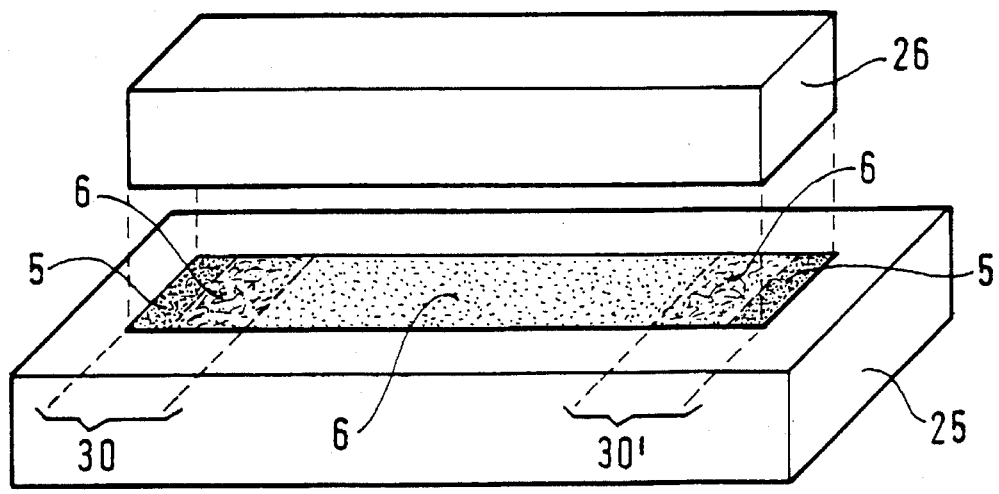
FIG. 6 is a highly schematic view of a third embodiment of the method in accordance with the invention as applied to a parallelpiped-shaped part.

EXAMPLE 3 (see FIG. 6)

A parallelpiped-shaped part with dimensions 8×1.6×40 $mm^3$ is obtained in the following manner.

Parallelpiped-shape blocks 30 and 30' of silver foam of the FIG. 2 type are placed at each end of a steel die 25 with an associated steel punch 26 to apply uni-axial compression.

Silver powder is then introduced into the end parts of these parallelpiped-shaped blocks; finally, the die 25 and the remainder of the parallelpiped-shaped blocks 30 and 30' are filled with grains 6 of precursors.

After the die is closed by the punch 26, a force of 75 000 Newtons is applied. Following removal from the mold and heat treatment as already described, the metal connections are found to have the same electrical performance as in the previous examples.

EXAMPLES 4–5–6

These examples are respectively analogous in all ways to examples 1–2–3 except for the nature of the grains. Instead of a stoichiometric mixture of precursors, a pre-synthesized $Y_1Ba_2Cu_3O_7$ powder is employed (Rhone Poulenc SU57).

It is mixed with 10% by weight of "pellicular" silver powder, that is to say powder in which the grains are disks with a diameter between 10 and 40 μm and a thickness between 0.1 and 0.5 μm (Heraeus HCF-38).

Forming is exactly as described for the previous examples; however, during the heat treatment the period at between 855° C. and 880° C. is reduced to seven hours. This yields a product showing more homogeneous sintering shrinkage.

Of course, the invention is not limited to the embodiments that have just been described. It would be possible to replace any means with equivalent means without departing from the scope of the invention; specifically, straw or mesh-type pore structures can be used instead of the metal foam. Gold or copper may be substituted for silver.

We claim:

1. In a method of implementing a high-performance connection between a metal and a solid superconductive ceramic member, including the steps of introducing grains or powder of said superconductive ceramic or of its precursors into a mold, juxtaposing in said mold, with said superconductive ceramic grains or powder, at least one volume of silver powder or gold powder, and compressing the superconductive ceramic grains or powder, or the precursors, and the silver powder or gold powder, and sintering the superconductive ceramic, or synthesizing and then sintering the superconductive ceramic, the improvement further comprising a step of integrating into said mold, at a desired level of said connection, a silver, gold or copper foam, straw or mesh body of a porous nature having open pores, sized to contain within said open pores of said body, a volume in excess of said volume of said silver or gold powder, and wherein, open pores of said body are larger than said gold or silver powder and larger than said grains or powder of said superconductive ceramic or its precursors, and wherein said step of juxtaposing in said mold said superconductive ceramic grains or powder and said volume of silver powder or gold powder comprises first introducing into said mold and said porous body a volume of silver or gold powder, with said volume of silver or gold powder being less than the volume of said pores of said porous body, and secondly introducing into said mold said grains or powder of said superconductive ceramic, or said precursors, prior to the compressing step, thereby implementing a low electric resistance connection between said metal and said superconductive ceramic capable of carrying high currents at a rated temperature, with the connection free of cracking, having excellent resistance to thermal shock and a contact resistance that is substantially constant throughout a range of superconductive material operating conditions.

2. A method according to claim 1, wherein said body is silver and said volume of silver or gold powder is silver powder.

3. A method according to claim 1, wherein less than 15% of the weight of said grains introduced into said mold constitutes pellicular silver powder.

* * * * *